United States Patent
Inoue et al.

(10) Patent No.: US 8,845,929 B2
(45) Date of Patent: Sep. 30, 2014

(54) ULTRAVIOLET LIGHT EMITTING MATERIAL

(75) Inventors: Osamu Inoue, Osaka (JP); Hiroshi Asano, Osaka (JP); Masahiro Sakai, Kyoto (JP); Mikihiko Nishitani, Nara (JP); Masumi Izuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/811,139

(22) PCT Filed: Nov. 24, 2011

(86) PCT No.: PCT/JP2011/006550
§ 371 (c)(1),
(2), (4) Date: Jan. 18, 2013

(87) PCT Pub. No.: WO2012/095920
PCT Pub. Date: Jul. 19, 2012

(65) Prior Publication Data
US 2013/0119381 A1 May 16, 2013

(30) Foreign Application Priority Data
Jan. 14, 2011 (JP) .................................. 2011-005802

(51) Int. Cl.
C09K 11/59 (2006.01)
C09K 11/70 (2006.01)
C09K 11/64 (2006.01)
C09K 11/62 (2006.01)
H01L 33/28 (2010.01)

(52) U.S. Cl.
CPC ............ C09K 11/703 (2013.01); C09K 11/642 (2013.01); C09K 11/623 (2013.01); H01L 33/285 (2013.01)
USPC .................................................. 252/301.6 P

(58) Field of Classification Search
CPC ...................................................... H01L 33/305
USPC .................................................. 252/301.6 P
See application file for complete search history.

(56) References Cited

U.S. PATENT DOCUMENTS 5,478,499 A * 12/1995 Satoh et al. ............. 252/301.6 P
7,821,022 B2 10/2010 Kim
(Continued)

FOREIGN PATENT DOCUMENTS

CN 101771119 7/2007
JP 1-168789 7/1989
(Continued)

OTHER PUBLICATIONS

U. Ozgur, Ya. I. Alivov, C. Liu, A. Teke, M. A. Reschikov, S. Dogan, V. Avrutin, S.-J. Cho, and H. Morkoc, "A Comprehensive Review of ZnO Materials and Devices", J. Appl. Phys. 98, 041301, 62-64 (2005).*

(Continued)

*Primary Examiner* — Matthew Reames
*Assistant Examiner* — John Bodnar
(74) *Attorney, Agent, or Firm* — Hamre, Schumann, Mueller & Larson, P.C.

(57) ABSTRACT

The present invention provides a zinc oxide-based ultraviolet light emitting material showing intense emission in the ultraviolet region. The present invention is an ultraviolet light emitting material containing: zinc and oxygen as main components; at least one element selected from the group consisting of aluminum, gallium, and indium, as a first sub-component; and phosphorus as a second sub-component. This material has n-type conductivity.

15 Claims, 2 Drawing Sheets

(56) References Cited

U.S. PATENT DOCUMENTS

| | | |
|---|---|---|
| 2002/0030196 A1* | 3/2002 | Iwata et al. .................. 257/102 |
| 2003/0132449 A1* | 7/2003 | Hosono et al. ............... 257/103 |
| 2007/0126021 A1* | 6/2007 | Ryu et al. ..................... 257/103 |
| 2008/0277657 A1 | 11/2008 | Jeong et al. |

FOREIGN PATENT DOCUMENTS

| | | |
|---|---|---|
| JP | 6-340874 | 12/1994 |
| JP | 2002-094114 | 3/2002 |
| JP | 2003-277748 | 10/2003 |
| JP | 2006-348244 | 12/2006 |
| JP | 2008-547235 | 12/2008 |
| JP | 2009-209265 | 9/2009 |

OTHER PUBLICATIONS

Chen, et al., "Formation Mechanism and Properties of In, p. Codoped p-type ZnO Thin Film", Chinese Journal of Luminescence, vol. 30, No. I, Feb. 28, 2009, pp. 12-18.

* cited by examiner

ULTRAVIOLET LIGHT EMITTING MATERIAL

TECHNICAL FIELD

The present invention relates to materials that emit light in the ultraviolet region, and in particular, relates to an ultraviolet light emitting material containing zinc oxide as a main component and to a method for producing the material. The present invention also relates to a light emitting device using the ultraviolet light emitting material.

BACKGROUND ART

Conventionally, zinc oxide is known as a self-activated phosphor represented by ZnO:Zn and having a broad emission spectrum with a peak around 500 nm, and used as a green light emitting phosphor material excited by an electron beam for vacuum fluorescent displays. In this ZnO:Zn phosphor, the Zn-to-O ratio is greater than 1 and excess Zn is present. It is believed that the zinc interstitials or oxygen vacancies contribute to the green light emission of the phosphor.

On the other hand, zinc oxide is a compound semiconductor with a band gap of 3.4 eV, and is also strongly expected to be used, as a material capable of emitting light at shorter wavelengths in the ultraviolet region due to the interband transition, for phosphor exciting light sources, light emitting diodes (LEDs), etc. In fact, however, the above-mentioned zinc interstitials or oxygen vacancies are easily formed in zinc oxide, and conventional ZnO-based materials show only very weak emission in the ultraviolet region, although they easily exhibit relatively intense emission in the green-blue region.

It has been reported that when zinc oxide is heat-treated in a hydrogen-containing gas atmosphere or hydrogen is introduced into zinc oxide by hydrogen plasma treatment or the like in order to solve this problem, ultraviolet emission is increased while green emission is suppressed (Patent Literatures 1 and 2).

CITATION LIST

Patent Literature

Patent Literature 1 JP 2003-277748 A
Patent Literature 2 JP 2006-348244 A

SUMMARY OF INVENTION

Technical Problem

The ultraviolet emission of zinc oxide is increased by the techniques described in Patent Literatures 1 and 2, but it is still not enough. Thus, it is an object of the present invention to provide a zinc oxide-based ultraviolet light emitting material showing intense emission in the ultraviolet region and a light emitting device using the material.

Solution to Problem

An embodiment of the present invention is an ultraviolet light emitting material containing: zinc and oxygen as main components; at least one element selected from the group consisting of aluminum, gallium, and indium, as a first sub-component; and phosphorus as a second sub-component. The material has n-type conductivity.

From another aspect, an embodiment of the present invention is a method for producing the ultraviolet light emitting material. The method includes a step of reacting: a source of zinc; a source of oxygen; a source of at least one first sub-component element selected from the group consisting of aluminum, gallium, and indium; and a source of phosphorus. A compound containing the first sub-component element and phosphorus is used as the source of the first sub-component element and the source of phosphorus.

Another embodiment of the present invention is a method for producing the ultraviolet light emitting material. The method includes heat-treating a raw material under a neutral atmosphere or a reducing atmosphere. The raw material contains: zinc oxide; a source of at least one first sub-component element selected from the group consisting of aluminum, gallium, and indium; and a source of phosphorus.

From still another aspect, an embodiment of the present invention is a light emitting device having: the ultraviolet light emitting material; and a p-type conductive material that is joined together with the ultraviolet light emitting material.

Advantageous Effects of Invention

According to the present invention, a zinc oxide-based ultraviolet light emitting material showing intense emission in the ultraviolet region and a light emitting device using the material are provided.

DESCRIPTION OF EMBODIMENTS

Figure 1:
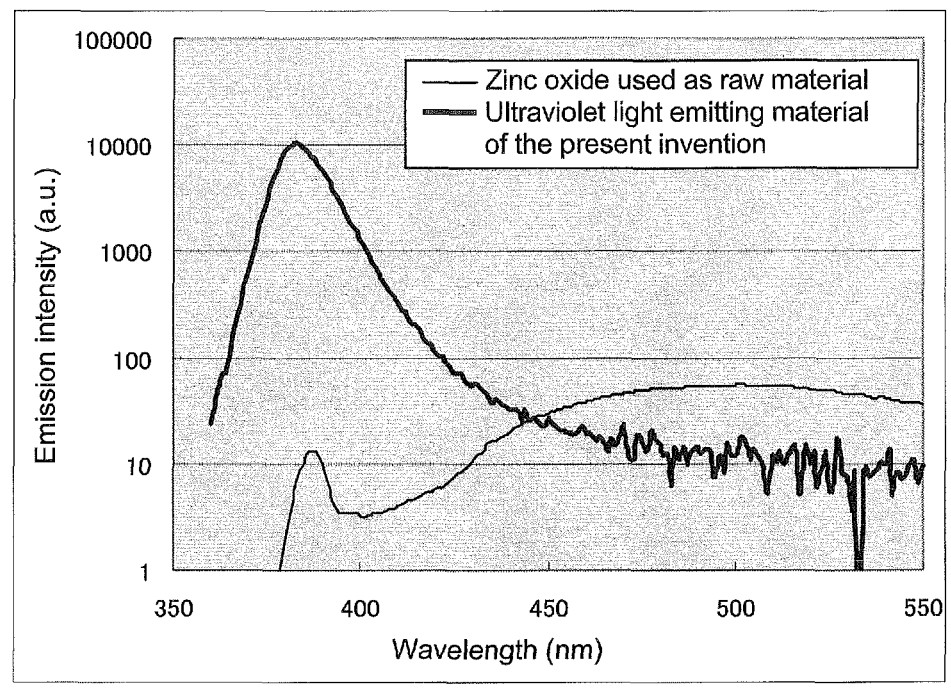
FIG. 1 is a diagram of emission spectra measured for an ultraviolet light emitting material according to an embodiment of the present invention and zinc oxide used as a raw material.

Hereinafter, embodiments and examples of the present invention will be described. The present invention is by no means limited to these embodiments and examples, and can be modified in various ways as appropriate without departing from the technical scope of the present invention.

An embodiment of the present invention is an ultraviolet light emitting material containing: zinc and oxygen as main components; at least one element selected from the group consisting of aluminum, gallium, and indium, as a first sub-component; and phosphorus as a second sub-component. The material has n-type conductivity.

In a preferred aspect of this embodiment, a total content of aluminum, gallium, and indium is not less than 0.03 at. % and not more than 3.0 at. % relative to zinc.

In a preferred aspect of this embodiment, a content of phosphorus is not less than 0.03 at. % and not more than 3.0 at. % relative to zinc.

In a preferred aspect of this embodiment, the first sub-component is gallium.

In a preferred aspect of this embodiment, the ultraviolet light emitting material further contains tungsten as a third sub-component.

In a preferred aspect of this embodiment, a content of tungsten is not less than 0.01 at. % and not more than 1.0 at. % relative to zinc.

Another embodiment of the present invention is a method for producing the ultraviolet light emitting material. The method includes a step of reacting: a source of zinc; a source of oxygen; a source of at least one first sub-component element selected from the group consisting of aluminum, gallium, and indium; and a source of phosphorus. A compound containing the first sub-component element and phosphorus is used as the source of the first sub-component element and the source of phosphorus.

In a preferred aspect of this embodiment, the compound containing the first sub-component element and phosphorus is a phosphide of the first sub-component element.

In a preferred aspect of this embodiment, the compound containing the first sub-component element and phosphorus is a phosphate of the first sub-component element.

Still another embodiment of the present invention is a method for producing the ultraviolet light emitting material. The method includes heat-treating a raw material under a neutral atmosphere or a reducing atmosphere. The raw material contains: zinc oxide; a source of at least one first sub-component element selected from the group consisting of aluminum, gallium, and indium; and a source of phosphorus.

Still another embodiment of the present invention is a light emitting device having: the ultraviolet light emitting material; and a p-type conductive material that is joined together with the ultraviolet light emitting material.

In a preferred aspect of this embodiment, the ultraviolet light emitting material and the p-type conductive material are joined together by placing one on the other.

In a preferred aspect of this embodiment, the p-type conductive material is a nitride containing gallium as a main component.

In the present invention, an "ultraviolet light emitting material" refers to a material having an emission peak wavelength of 400 nm or less.

[About Ultraviolet Light Emitting Material of the Present Invention]

The present inventors added various compound powders alone or in combination to a normal ZnO powder and heat-treated the resulting mixtures under various conditions, and evaluated the emission characteristics of the resulting materials. As a result, they found that a material obtained by adding a plurality of specific elements, even without using hydrogen, can exhibit dramatically improved ultraviolet emission compared with that of the ZnO powder containing no such specific elements.

A first sub-component required is at least one selected from the group consisting of aluminum, gallium, and indium. In the presence of this first sub-component, green emission of zinc oxide is suppressed and ultraviolet emission thereof is improved. In addition, in the presence of this first sub-component, zinc oxide decreases its electrical resistivity and exhibits significant n-type conductivity. Presumably, this is because some of divalent zinc sites of zinc oxide are substituted by trivalent aluminum, gallium or indium and thereby a donor level is formed in the band gap just below the conduction band. This means that at least a part of aluminum, gallium or indium needs to substitute for zinc, and a mere mixture with zinc oxide is not effective in improving ultraviolet emission luminance.

Among these three elements, gallium most easily substitutes for zinc, while aluminum and indium less easily substitute for zinc. Therefore, gallium is most effective and most desirable in terms of characteristics. On the other hand, in terms of cost, aluminum is least expensive, while gallium and indium are rarer and more expensive than aluminum. Therefore, aluminum is most desirable in terms of cost. It is less advantageous to use indium than to use gallium or aluminum.

However, the addition of only one of these elements is not very effective in improving ultraviolet emission luminance. It is phosphorus, a second sub-component, that dramatically increases the ultraviolet emission luminance when used in combination with the above first sub-component. The emission luminance improving mechanism of phosphorus is not clear. However, the facts that the addition of phosphorus alone has little effect in improving the luminance and that the addition of phosphorus tends to promote the substitution of aluminum, gallium or indium for Zn sites suggest that the substitution of phosphorus anions for oxygen sites of ZnO prevents the electroneutrality of ZnO from being broken by the substitution of aluminum, gallium or indium for Zn sites, and as a result, the substitution of aluminum, gallium or indium is promoted and the ultraviolet emission luminance is increased.

Since the object of the present invention is to improve the ultraviolet emission luminance of zinc oxide, the main components of the ultraviolet light emitting material need to be zinc and oxygen. As used herein, the phrase "an ultraviolet light emitting material contains zinc as a main component" refers to that the content of zinc is 80% or more, more desirably 90% or more, of the cationic elements, and the phrase "an ultraviolet light emitting material contains oxygen as a main component" refers to that the content of oxygen is 80% or more, more desirably 90% or more, of the anionic elements. The content of the first sub-components (the total content of aluminum, gallium and indium) is desirably not less than 0.03 at. % and not more than 3.0 at. % relative to zinc. The reason why the content of the first sub-components is desirably not less than 0.03 at. % and not more than 3.0 at. % relative to zinc is that less than 0.03 at. % does not have a significant effect, and it is no use using more than 3.0 at. % because no further increase in the luminance is observed. However, even less than 0.03 at. % or more than 3.0 at. % is better than nothing for the increase in the luminance. This content of the first sub-components does not refer to the specific amount of the first sub-components that substitute for zinc sites but the amount of the first sub-components contained in the resulting ultraviolet light emitting material.

The content of phosphorus also is desirably not less than 0.03 at. % and not more than 3.0 at. % relative to zinc, and this range is desirable for the same reason. From the above consideration, it seems desirable that the content of phosphorus be about the same as that of the first sub-components. However, since there is no direct evidence that phosphorus actually substitutes for oxygen sites of zinc oxide and the resulting ultraviolet light emitting material exhibits n-type conductivity, it is believed that the amount of phosphorus incorporated into the crystal structure of zinc oxide is smaller than that of the first sub-components.

It is also effective that the ultraviolet light emitting material further contains tungsten as a third sub-component in addition to the above first and second sub-components. The presence of tungsten further increases the ultraviolet emission luminance. However, the luminance improving mechanism of tungsten is not clear at present.

Tungsten oxide is also known as an effective additive to increase green emission luminance and prevent luminance degradation of a ZnO:Zn phosphor that emits green light. It is believed that tungsten oxide exhibits this effect because it prevents the surface of zinc oxide from being contaminated with carbon dioxide or water.

However, this effect is contrary to the object of the present invention to suppress green emission and improve ultraviolet emission. According to the study of the present inventors, no increase in the luminance was observed when firing was performed in nitrogen containing neither carbon dioxide nor water. This indicates that the effect of tungsten is independent of the mechanism for preventing contamination with carbon dioxide or water as seen in the green emission of ZnO:Zn.

According to the study of the present inventors, the presence of tungsten seems to exhibit the effect when an ultraviolet light emitting phosphor is synthesized. One of the possible reasons for the effect is that tungsten is a high-valent metal having a valence of up to 6, which changes easily, and having a high diffusion rate, and thus works as an oxygen content regulator. Another reason is that tungsten oxide has a high diffusion rate and easily forms a compound with an impurity which forms a substitutional solid solution with zinc oxide to suppress ultraviolet emission, like alkali metal oxides such as lithium oxide, sodium oxide and potassium oxide, and thus tungsten oxide prevents the impurity from forming a substitutional solid solution with zinc oxide.

If the above reasons are correct, tungsten does not need to be solid-solved in zinc oxide, unlike aluminum, gallium, and indium. There is, in fact, no evidence that tungsten is solid-solved in zinc oxide.

The content of tungsten is desirably not less than 0.01 at. % and not more than 1.0 at. % relative to zinc. This is because less than 0.01 at. % does not have a significant effect, and it is no use using more than 1.0 at. % because the ultraviolet emission luminance begins to decrease. Presumably, the luminance decreases when the content of tungsten exceeds 1.0 at. % because tungsten is easily concentrated on the surface.

The ultraviolet light emitting material of the present invention only has to contain zinc, oxygen, a first sub-component, a second sub-component, and an arbitrary third sub-component, and it may further contain other components as long as its characteristics are not impaired. For example, magnesium oxide exhibits an effect of increasing the band gap of zinc oxide (i.e., shifting the emission wavelength of zinc oxide to the short wavelength side) when a small amount of magnesium oxide is solid-solved in zinc oxide. The use of the above sub-components with this zinc oxide-magnesium oxide solid solution system is also effective in suppressing green emission and improving ultraviolet emission intensity. Therefore, the ultraviolet light emitting material of the present invention may contain magnesium instead of a part of zinc, and cationic components of the total of zinc and magnesium are regarded as main components of the cationic components of the material.

The ultraviolet light emitting material of the present invention exhibits intense emission in the ultraviolet region. As shown in the following production method, this material can be produced without using flammable hydrogen and any special apparatus which is conventionally required, and thus has high mass productivity and safety. Therefore, it is advantageous in terms of not only productivity but also cost. This material can emit ultraviolet light with a luminance at least 15 times, further at least 300 times, as high as normal zinc oxide (zinc oxide which is not heat-treated).

Although the ultraviolet light emitting material of the present invention is a zinc oxide-based material, it has an electrical resistivity lower by an order to several orders of magnitude than that of normal zinc oxide, and thus is also suitable for use in light emitting devices.

[About Method for Producing Ultraviolet Light Emitting Material of the Present Invention]

The ultraviolet light emitting material of the present invention can be produced by reacting: a source of zinc; a source of oxygen; a source of at least one first sub-component element selected from the group consisting of aluminum, gallium, and indium; and a source of phosphorus. Examples of the reaction method includes a solid phase method, a liquid phase method, and a gas phase method.

The solid phase method is a method in which powders of raw materials (such as metal oxides and metal carbonates) containing respective element sources are mixed, and the mixture is subjected to heat treatment at a certain temperature or higher to react the elements.

The liquid phase method is a method in which a solution containing the respective element sources is prepared to precipitate a solid phase from the solution, or this solution is applied onto a substrate, dried and then subjected to heat treatment, etc. at a certain temperature or higher to obtain a solid phase.

The gas phase method is a method in which a solid phase in the form of a thin film is obtained by a method such as vapor deposition, sputtering, CVD, etc.

In the present invention, any of the above methods can be used. When the above light emitting material is used in the powder form, the solid phase method is generally suitable because of relatively low production cost and ease of mass production.

In order to synthesize the ultraviolet light emitting material of the present invention by the solid phase method, a mixture of raw materials need be subjected to heat treatment to react them. When the liquid phase method or the gas phase method is used to synthesize the material, it is often better to perform heat treatment to improve the crystallinity thereof and further increase the ultraviolet emission luminance. In these cases, heat treatment in an oxygen-rich atmosphere makes it difficult to improve the ultraviolet emission intensity. Therefore, it is desirable to perform heat treatment under a neutral atmosphere such as nitrogen gas, argon gas or helium gas, not in the oxygen-rich oxidizing air. Heat treatment may usually be performed in inexpensive nitrogen gas. The concentration of oxygen contained in the atmosphere (in particular, nitrogen gas) is desirably 100 ppm or less, and more desirably 10 ppm or less.

Furthermore, in order to reduce the oxygen partial pressure, heat treatment may be performed under a reducing atmosphere obtained by mixing hydrogen gas or the like with the atmospheric gas because the effects of the sub-components are not impaired by the heat treatment. However, flammable hydrogen gas causes safety concerns. Therefore, a neutral atmospheric gas (in particular, nitrogen gas) is commonly used.

Furthermore, a previously prepared powder compact can be heat-treated to obtain a sintered body. Also in this case, the presence of the sub-components produces the effect of improving the ultraviolet emission luminance.

In the synthesis of the ultraviolet light emitting material of the present invention, zinc oxide ZnO, zinc hydroxide $Zn(OH)_2$, zinc carbonate $ZnCO_3$, or the like may be used as a starting material for the source of zinc and the source of oxygen, and ZnO is commonly used. As starting materials for the source of aluminum, the source of gallium, the source of indium, and the source of tungsten, respectively, oxides, hydroxides, carbonates, etc. may be used, and oxides are commonly used.

The problem is the source of phosphorus in selecting a starting material. It is not impossible to use an oxide as the source of phosphorus, but since a typical oxide of phosphorus $P_2O_5$ is very hygroscopic and reacts vigorously with water, it is hard to use. In order to prevent this, salts like phosphates such as diammonium hydrogen phosphate and ammonium dihydrogen phosphate can be used. When heated, these ammonium salts release ammonia and water at low temperatures and are converted into $P_2O_5$. Therefore, the same effects as those of the direct use of $P_2O_5$ can be obtained.

However, even if such an oxide or salt of phosphorus is used, it is difficult to obtain a desired material composition because, when heated for the reaction with ZnO, the oxide of phosphorus itself having sublimability may sublime before it reacts with ZnO.

In order to prevent this, more phosphorus than necessary may be added, or zinc phosphate, which is a compound of phosphorus and zinc, may be synthesized previously for use. However, a more desirable method is to use a compound containing the first sub-component element and phosphorus as the source of the first sub-component element and the source of phosphorus.

As this compound, a phosphide of the first sub-component element (such as aluminum phosphide AlP, gallium phosphide GaP, or indium phosphide InP) can be used. However, these phosphides are generally expensive and may react with water to produce highly toxic hydrogen phosphide. So, as a more desirable compound, a phosphate of the first sub-component element (such as aluminum phosphate, gallium phosphate, or indium phosphate) can be used.

In the method of using a compound containing the first sub-component element and phosphorus, the luminance is increased significantly even if a relatively small amount of the compound is added. Presumably, this is because evaporation of phosphorus is suppressed and solid solution of aluminum, gallium or indium into ZnO is promoted by the presence of phosphorus in the immediate vicinity of these elements.

A high-luminance ultraviolet light emitting material can be produced in the manner as described above. This production method makes it possible to produce an ultraviolet light emitting material without using flammable hydrogen and any special apparatus which is conventionally required, and thus it is advantageous in terms of not only mass productivity and safety but also cost.

[About Electroluminescent (EL) Device Using Ultraviolet Light Emitting Material of the Present Invention]

Next, a light emitting device using the ultraviolet light emitting material of the present invention is described. Since the material of the present invention has n-type conductivity as mentioned above, it forms a pn junction with a material having p-type conductivity when they are joined together. Thus, when an electric current is applied in the forward direction, electroluminescence (EL) can be obtained.

As a material to be joined together with the material of the present invention to form a light emitting device, any material may be used as long as it has p-type conductivity. Since EL occurs in the vicinity of the junction interface, emitted light that has passed through either the material of the present invention or the p-type conductive material used is observed. In this case, it is desirable to use a p-type conductive material having a larger band gap than the material of the present invention because such a material does not absorb EL.

Examples of the material having a larger band gap than the material of the present invention and having p-type conductivity include various materials such as NiO, $Zn_{1-x}Mg_xO:N$, $SrCu_2O_2$, and a nitride containing gallium as a main component.

However, in order to obtain higher emission characteristics, it is desirable to use a material having a higher hole concentration and a higher hole mobility. From a practical standpoint, it is desirable to use a material that can be produced stably, is less toxic, and is chemically stable after the production. Among the above-listed p-type materials, it is difficult to increase the hole mobility of NiO. NiO also is reported to be toxic. The technique for producing nitrogen-doped ZnO-based materials such as $Zn_{1-x}Mg_xO:N$ has not been well established so far, and it is difficult to produce such materials stably. Materials containing a monovalent Cu or alkaline earth metal, such as $SrCu_2O_2$, have the disadvantage of poor chemical stability.

Therefore, a nitride containing gallium as a main component is the most desirable p-type conductive material. The nitride containing gallium as a main component is a material obtained by converting GaN, GaInN, AlGaN, AlGaInN, or the like into a p-type conductive material by Mg doping, etc. However, the light emitting device of the present invention is not limited to the use of these materials.

The light emitting device may have a pin junction structure used in a common light emitting diode, instead of a pn junction structure. In the pin junction structure, an ultrathin i layer having relatively high electrical insulation is inserted into the pn junction interface.

As for the method of forming a pn junction or a pin junction, any commonly used method can be used. For example, a thin film or a thick film of the material of the present invention may be formed on a previously prepared p-type conductive material as a substrate. Heat treatment may further be performed, if necessary. Alternatively, a p-type conductive material may be formed by any of various methods on the material of the present invention prepared as a substrate. Likewise, heat treatment may be performed, if necessary. However, the characteristics of the material of the present invention or the characteristics of the p-type conductive material may deteriorate depending on the conditions of the process for forming such a junction. For example, when a p-type material is formed on the material of the present invention as a substrate by a method such as sputtering, the emission efficiency of the material of the present invention drops due to sputter damage. Even if a post-treatment such as heat treatment is performed to recover the characteristics, it is difficult to optimize the treatment conditions for both the n-type conductive material and the p-type conductive material because the optimum conditions for these materials are not necessarily the same.

In order to prevent such a deterioration phenomenon, the light emitting device of the present invention is desirably configured such that one of the ultraviolet light emitting material and the p-type conductive material is placed on the other to form a junction. With such a configuration, the n-type material and the p-type material can each be prepared under the conditions in which its best performance can be achieved, and a light emitting device having a simple structure but exhibiting excellent ultraviolet light emission characteristics can be provided.

Figure 2:
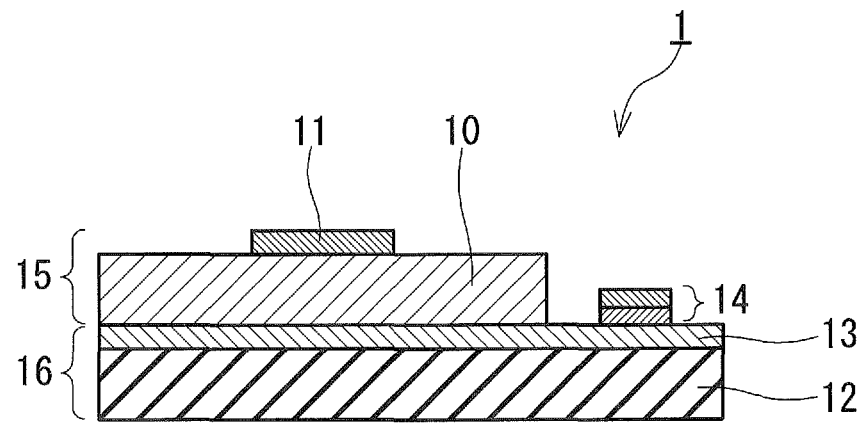
FIG. 2 is a diagram showing schematically a general structure of a light emitting device according to an embodiment of the present invention.

Next, a basic structure of a light emitting device is described. FIG. 2 is a diagram showing schematically a general structure of a light emitting device according to an embodiment of the present invention. In an n-type portion 15, for example, Al as a first electrode 11 is formed on the ZnO-based ultraviolet light emitting n-type conductive material 10 of the present invention. In a p-type portion 16, a p-type conductive material 13 is formed on a substrate 12 and for example, Ni/Au as a second electrode 14 is formed on the p-type conductive material 13. The n-type portion 15 is placed on the p-type portion 16 to form a light emitting device 1. The light emitting device 1 may be configured such that the p-type portion 16 is placed on the n-type portion 15.

As a specific method of the placement, the n-type portion 15 and the p-type portion 16 may be pressed against each other by applying external pressure thereto or a thin adhesive layer may be provided at the interface between the portions because they are easily separated by merely placing one on the other.

The light emitting device of the present invention exhibits intense emission in the ultraviolet region. It is, of course, possible to obtain a device exhibiting emission in the visible region by combining the device of the present invention and a common phosphor capable of absorbing ultraviolet light and emitting light in the visible region.

Hereinafter, an embodiment of the present invention will be described in more detail by way of examples.

Example 1

In Example 1, the synthesis of the ultraviolet light emitting material of the present invention and the evaluation of the characteristics thereof are described. The light emitting material of the present invention was synthesized by the solid phase method using a raw material powder of zinc oxide, raw material powders of oxides of other metal elements, and diammonium hydrogen phosphate.

As starting materials, a ZnO powder with a purity of 5N, $Al_2O_3$, $Ga_2O_3$, $In_2O_3$ and $WO_3$ powders with a purity of 4N, and diammonium hydrogen phosphate $(NH_4)_2HPO_4$ (special grade reagent) were prepared.

These raw materials were weighed at Zn/P/Ga/Al/In/W atomic ratios as shown in Table 1, and wet-mixed in a ball mill and dried to obtain powder mixtures.

These powder mixtures were each put into an alumina crucible, and fired at 800° C. for 2 hours in nitrogen gas or in a $N_2$-2.5% $H_2$ mixed gas in an electric furnace. The photoluminescence (PL) of each of these powders and that of the raw material ZnO powder (No. 0) with a purity of 5N were measured at an excitation wavelength of 325 nm.

FIG. 1 shows the emission spectra of samples No. 0 and No. 17, that is, the ZnO powder used as the raw material and the No. 17 powder of the present invention, as examples of emission spectra (since the difference in their emission luminances was too large, they were measured with different sensitivities of a measuring instrument). In this figure, an emission with a peak around 380 nm is the ultraviolet emission intended by the present invention. On the other hand, an emission around 500 nm is the green emission. In FIG. 1, the conventional zinc oxide exhibits both ultraviolet emission and green emission, but its ultraviolet emission luminance is low. In contrast, FIG. 1 shows that the material of the present invention exhibits much more intense ultraviolet emission and exhibits virtually no green emission.

The peak intensities of the samples were measured in the same manner, and from the measurement results, the ratios of these peak intensities to the peak intensity of the raw material ZnO powder (No. 0) around 380 nm were calculated, taking the latter intensity as 1.0. Table 1 shows the results.

TABLE 1

| No. | Zn | Ga | P | W | Others | Firing conditions | Ultraviolet emission intensity | |
|---|---|---|---|---|---|---|---|---|
| 0 | 100 | | | | | None | 1.0 | Com. Ex. |
| 1 | 100 | | | | | Nitrogen | 0.5 | Com. Ex. |
| 2 | 100 | | | | | $N_2$-2.5% $H_2$ | 7.9 | Com. Ex. |
| 3 | 100 | 0.01 | | | | Nitrogen | 2.0 | Com. Ex. |
| 4 | 100 | 0.03 | | | | Nitrogen | 4.3 | Com. Ex. |
| 5 | 100 | 0.1 | | | | Nitrogen | 8.8 | Com. Ex. |
| 6 | 100 | 0.3 | | | | Nitrogen | 9.3 | Com. Ex. |
| 7 | 100 | 0.5 | | | | Nitrogen | 9.5 | Com. Ex. |
| 8 | 100 | 1.0 | | | | Nitrogen | 9.7 | Com. Ex. |
| 9 | 100 | 3.0 | | | | Nitrogen | 8.1 | Com. Ex. |
| 10 | 100 | 5.0 | | | | Nitrogen | 6.5 | Com. Ex. |
| 11 | 100 | 0.3 | | | | $N_2$-2.5% $H_2$ | 108 | Ref. Ex. |
| 12 | 100 | 0.01 | 1.0 | | | Nitrogen | 17 | Example |
| 13 | 100 | 0.03 | 1.0 | | | Nitrogen | 44 | Example |
| 14 | 100 | 0.1 | 1.0 | | | Nitrogen | 129 | Example |
| 15 | 100 | 0.3 | 1.0 | | | Nitrogen | 442 | Example |
| 16 | 100 | 0.5 | 1.0 | | | Nitrogen | 887 | Example |
| 17 | 100 | 1.0 | 1.0 | | | Nitrogen | 930 | Example |
| 18 | 100 | 3.0 | 1.0 | | | Nitrogen | 876 | Example |
| 19 | 100 | 5.0 | 1.0 | | | Nitrogen | 775 | Example |
| 20 | 100 | 0.5 | 0.01 | | | Nitrogen | 15 | Example |
| 21 | 100 | 0.5 | 0.03 | | | Nitrogen | 38 | Example |
| 22 | 100 | 0.5 | 0.1 | | | Nitrogen | 112 | Example |
| 23 | 100 | 0.5 | 0.3 | | | Nitrogen | 393 | Example |
| 24 | 100 | 0.5 | 0.5 | | | Nitrogen | 726 | Example |
| 25 | 100 | 0.5 | 3.0 | | | Nitrogen | 891 | Example |
| 26 | 100 | 0.5 | 5.0 | | | Nitrogen | 843 | Example |
| 27 | 100 | | 0.5 | | Al = 0.5 | Nitrogen | 543 | Example |
| 28 | 100 | | 0.5 | | In = 0.5 | Nitrogen | 177 | Example |
| 29 | 100 | | 1.0 | | | Nitrogen | 1.2 | Com. Ex |
| 30 | 100 | 0.5 | 0.5 | 0.005 | | Nitrogen | 731 | Example |
| 31 | 100 | 0.5 | 0.5 | 0.01 | | Nitrogen | 760 | Example |
| 32 | 100 | 0.5 | 0.5 | 0.1 | | Nitrogen | 822 | Example |
| 33 | 100 | 0.5 | 0.5 | 1.0 | | Nitrogen | 869 | Example |
| 34 | 100 | 0.5 | 0.5 | 3.0 | | Nitrogen | 823 | Example |

As is apparent from Table 1, the samples No. 3 to No. 10 obtained by adding Ga and firing in nitrogen exhibited slightly higher ultraviolet emission luminances than the raw material powder No. 0 and the sample No. 1 obtained by firing the powder No. 0 in nitrogen, but their ultraviolet emission increasing effect was not significant. The sample No. 2, which is a conventional material obtained by firing in the presence of hydrogen also exhibited a slightly higher ultraviolet emission luminance, but its ultraviolet emission increasing effect was not significant. In contrast, the samples No. 12 to No. 26, although they were obtained by firing in nitrogen, achieved an ultraviolet emission luminance increasing effect at least 15 times as high as the raw material zinc oxide powder. The sample No. 11, which is not a conventional material but was obtained by adding a small amount of Ga and firing in the presence of hydrogen according to the conventional technique, showed a clear increase in the ultraviolet emission luminance. However, the sample No. 15 containing the same amount of Ga exhibited an ultraviolet emission luminance about 4 times as high as No. 11, which reveals how effective the addition of both Ga and P is in improving the luminance. In addition, the fact that the luminance can be increased without using hydrogen gas is advantageous because hydrogen gas is a dangerous gas.

As for the samples No. 12 to No. 19 containing a fixed amount (1.0 at. %) of P and increased amounts of Ga, a significant effect was observed in the samples No. 13 to No. 19 containing at least 0.03 at. % of Ga, although even the sample No. 12 containing 0.01 at. % of Ga was effective. The effect of increasing the Ga content was saturated at 3.0 at. % of the sample No. 18. This means that it is no use adding more than 3.0 at. % of Ga, and thus a desirable Ga content is not less than 0.03 at. % and not more than 3.0 at. %.

As for the samples No. 20 to No. 26 and No. 16 containing a fixed amount (0.5 at. %) of Ga and increased amounts of P, a significant effect was observed in the samples No. 21 to No. 26 and No. 16 containing at least 0.03 at. % of P, although even the sample No. 20 containing 0.01 at. % of P was effective. The effect of increasing the P content was saturated at 3.0 at. % of the sample No. 25. This means that it is no use adding more than 3.0 at. % of P, and thus a desirable P content is not less than 0.03 at. % and not more than 3.0 at. %.

Next, the ultraviolet emission intensity improving effect was observed also in the samples No. 27 and No. 28 containing Al and In instead of Ga. However, this effect was lower than that of the sample No. 24 containing the same amount of Ga and the same amount of P, and in particular, the sample No. 28 containing In was least effective. The present inventors performed experiments using P and various amounts of Al or In in combination, as in the case of Ga. Al and In also were effective in the same composition range as Ga, but Ga is most effective, followed by Al. The effect of In was relatively low. Thus, it is most desirable to add Ga, followed by Al.

As mentioned above, a desirable Ga content is not less than 0.03 at. % and not more than 3.0 at. %. Since Al and In have the same effects as Ga (the effects of increasing the ultraviolet emission luminance and suppressing the green emission luminance), it is desirable that the total content of aluminum, gallium, and indium be not less than 0.03 at. % and not more than 3.0 at. % relative to zinc.

The sample No. 29, in which only P was added and no Ga was added, exhibited little ultraviolet emission intensity improving effect.

Next, the results of the samples No. 30 to No. 34 further containing W in addition to Ga and P were compared with the result of the sample No. 24 containing no W. As a result, a further increase in the ultraviolet emission intensity was observed in the samples No. 30 to No. 34. This effect was significant in the samples No. 31 to 34 containing not less than 0.01 at. % of W, but was saturated in the sample No. 34 containing more than 1.0 at. % of W. This means that it is no use adding more than 1.0 at. % of W, and thus a desirable W content is not less than 0.01 at. % and not more than 1.0 at. %.

The above results reveal that a composition obtained by reacting: zinc oxide as a main component; a small amount of at least one selected from the group consisting of gallium oxide, aluminum oxide, and indium oxide; and phosphorus, that is, a composition containing: zinc and oxygen as main components; at least one element selected from the group consisting of aluminum, gallium, and indium, as a first sub-component; and phosphorus as a second sub-component could exhibit a dramatic increase in the ultraviolet emission luminance. The addition of tungsten in addition to the above components allowed the resulting composition to have improved characteristics.

Example 2

In Example 2, the effect by a change of raw materials in producing the ultraviolet light emitting material of the present invention is described. As the source of zinc and the source of oxygen, the same ZnO powder with a purity of 5N was used as in Example 1.

Next, as the source of gallium and the source of phosphorus, a gallium phosphide GaP powder was prepared by grinding a GaP single crystal.

Next, gallium nitrate and diammonium hydrogen phosphate (special grade reagents) were prepared, and were each dissolved in water to obtain aqueous solutions. Then, the aqueous solutions were mixed together to produce a precipitate. This precipitate was washed thoroughly with water, and then dried at 150° C. to obtain a powder. The X-ray diffraction showed that this powder was in an amorphous state. Then, it was found that the powder was an amorphous gallium phosphate hydrate, because it was transformed into a crystalline gallium phosphate at 850° C. when it was dehydrated by heating.

These gallium phosphide powder and amorphous gallium phosphate hydrate, and the same $Ga_2O_3$ with a purity of 4N and diammonium hydrogen phosphate $(NH_4)_2HPO_4$ (special grade reagent) as used in Example 1 were prepared as raw materials.

These raw materials were weighed at Zn/Ga/P ratios as shown in Table 2. As for the amorphous gallium phosphate, a decrease in the weight during heating was measured and corrected for the weighing.

These powders were wet-mixed in a ball mill using ethanol as a solvent in the same manner as in Example 1, and then dried to obtain powder mixtures. The powder mixtures thus obtained were each put into an alumina crucible, and fired at 800° C. for 2 hours in nitrogen gas in an electric furnace. The photoluminescence (PL) of each of the powders thus obtained was measured, and the PL of the raw material ZnO powder with a purity of 5N (No. 0) was also measured for comparison. The average particle size of each of the powders was measured with a particle size analyzer. Table 2 shows the results.

TABLE 2

| No. | Ga source Phosphorus source | Content (at. %) Ga | P | Firing Conditions | Ultraviolet emission intensity | Particle size (μm) |
|---|---|---|---|---|---|---|
| 0 | None | 0.0 | 0.0 | None | 1.0 | 0.7 |
| 24 | $Ga_2O_3$ | 0.5 | 0.5 | Nitrogen | 726 | 2.3 |
| 17 | Diammonium hydrogen phosphate | 1.0 | 1.0 | Nitrogen | 930 | 1.8 |
| 35 | Gallium phosphide | 0.5 | 0.5 | Nitrogen | 1014 | 1.3 |
| 36 | | 1.0 | 1.0 | Nitrogen | 1162 | 1.2 |
| 37 | Gallium phosphate | 0.5 | 0.5 | Nitrogen | 953 | 0.8 |
| 38 | | 1.0 | 1.0 | Nitrogen | 1008 | 0.8 |

As is apparent from Table 2, the samples No. 35 to No. 38 each using gallium phosphide or gallium phosphate, which is a compound of phosphorus and gallium, as the source of gallium and the source of phosphorus exhibited higher ultraviolet emission luminances than the samples No. 17 and No. 24 each using different raw materials for the source of gallium and the source of phosphorus. In particular, a significant luminance increasing effect was observed in the sample containing a small amount of gallium and phosphorus. In addition, it was found that the samples No. 35 to No. 38 have the advantage that the powder particles grow less by firing and easily have a smaller particle size than the particles of the samples No. 17 and No. 24.

Example 3

In Example 3, a light emitting device using the ultraviolet light emitting material of the present invention is described. The same raw material powder mixture as used for the powder No. 17 of Example 1 was pressed in a mold, and the resulting powder compact was fired under the same conditions as in Example 1. Thus, a sintered body with a diameter of about 10 mm and a thickness of about 1 mm was obtained as a sample No. 39. The photoluminescence (PL) of this sample was measured in the same manner as in Example 1. As a result, ultraviolet emission with the same wavelength and almost the same intensity as those of the sample in the powder form was observed.

A light emitting device shown in FIG. 2 was produced using this sintered body. Al as a first electrode was vapor deposited on one surface of the obtained sintered body to form an n-type portion.

Next, a commercially available member, including a sapphire substrate and a p-type GaN layer formed thereon by doping GaN with Mg by the MOCVD method, was prepared, and layers of Ni and Au as a second electrode was formed on the p-GaN layer to obtain a p-type portion.

The n-type portion and the p-type portion thus obtained were pressed in contact with each other. Thus, a light emitting device configured by placing one portion on the other portion was formed.

Figure 3:
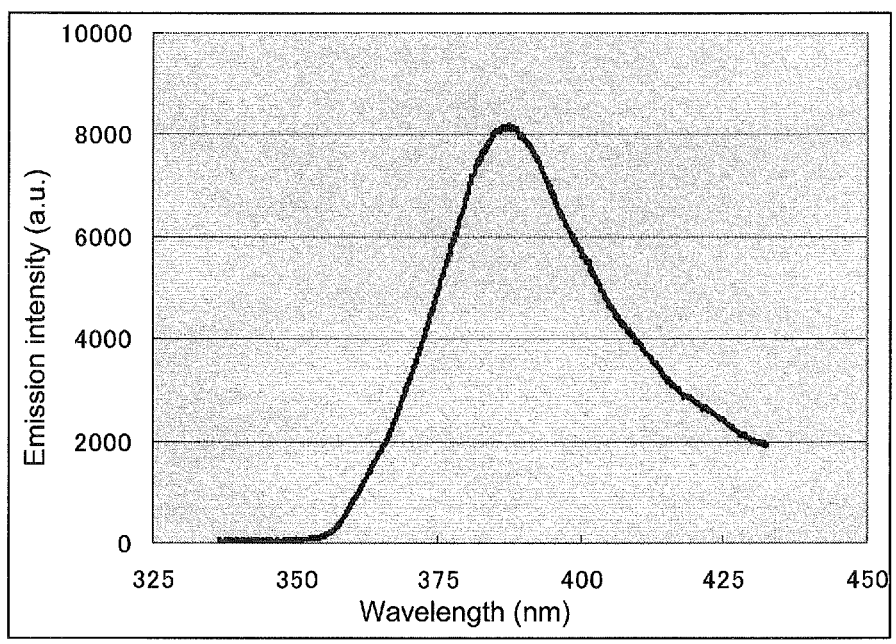
FIG. 3 is a diagram showing a measurement result of an electroluminescence (EL) spectrum of a light emitting device according to an embodiment of the present invention.

A voltage was applied between the Al electrode and the Ni/Au electrode of this device and an electric current was applied in the forward direction. Then, the device was observed from the side of the transparent sapphire substrate. As shown in FIG. 3, clear ultraviolet electroluminescence with a peak around 380 to 390 nm was observed, which confirmed that a light emitting device was obtained.

INDUSTRIAL APPLICABILITY

The ultraviolet light emitting material and the light emitting device of the present invention can be used in a wide variety of applications such as phosphor exciting materials, LED devices, and inorganic EL displays.

The invention claimed is:

1. An ultraviolet light emitting material comprising:
   zinc and oxygen, as main components;
   at least one element selected from the group consisting of aluminum, gallium, and indium, as a first sub-component; and
   phosphorus as a second sub-component,
   wherein a total content of aluminum, gallium, and indium is no less than 0.03 atomic percent and no more than 3.0 atomic percent, relative to a content of zinc, and
   the ultraviolet light emitting material has n-type conductivity.

2. The ultraviolet light emitting material according to claim 1, wherein a content of phosphorus is no less than 0.03 atomic percent and no more than 3.0 atomic percent, relative to a content of zinc.

3. The ultraviolet light emitting material according to claim 1, wherein the first sub-component is gallium.

4. An ultraviolet light emitting material comprising:
   zinc and oxygen, as main components.
   at least one element selected from the group consisting of aluminum, gallium, and indium, as a first sub-component;
   phosphorus as a second sub-component; and
   tungsten as a third sub-component,
   wherein the ultraviolet light emitting material has n-type conductivity.

5. The ultraviolet light emitting material according to claim 4, wherein a content of tungsten is no less than 0.01 atomic percent and no more than 1.0 atomic percent, relative to a content of zinc.

6. A method for producing the ultraviolet light emitting material according to claim 1, the method comprising a step of:
   reacting a source of zinc, a source of oxygen, a source of the at least one first sub-component element selected from the group consisting of aluminum, gallium, and indium, and a source of phosphorus,
   wherein a compound comprising at least one element selected for the at least one first sub-component element and phosphorus is used as the source of the at least one element selected for the at least one first sub-component element and the source of phosphorus.

7. The method according to claim 6, wherein the compound comprising the first sub-component element and phosphorus is a phosphide of the first sub-component element.

8. The method according to claim 6, wherein the compound comprising the first sub-component element and phosphorus is a phosphate of the first sub-component element.

9. A method for producing the ultraviolet light emitting material according to claim 1, the method comprising:
   heat-treating a raw material under a neutral atmosphere or a reducing atmosphere,
   wherein the raw material comprises: zinc oxide; a source of the at least one first sub-component element selected from the group consisting of aluminum, gallium, and indium; and a source of phosphorus.

10. A light emitting device comprising:
    the ultraviolet light emitting material according to claim 1; and
    a p-type conductive material that is joined together with the ultraviolet light emitting material.

11. The light emitting device according to claim 10, wherein the ultraviolet light emitting material and the p-type conductive material are joined together by placing one on the other.

12. The light emitting device according to claim 10, wherein the p-type conductive material is a nitride comprising gallium as a main component.

13. A light emitting device comprising:
    the ultraviolet light emitting material according to claim 4; and
    a p-type conductive material that is joined together with the ultraviolet light emitting material.

14. The light emitting device according to claim 13, wherein the ultraviolet light emitting material and the p-type conductive material are joined together by placing one on the other.

15. The light emitting device according to claim 13, wherein the p-type conductive material is a nitride comprising gallium as a main component.

* * * * *

UNITED STATES PATENT AND TRADEMARK OFFICE
CERTIFICATE OF CORRECTION

PATENT NO. : 8,845,929 B2 Page 1 of 1
APPLICATION NO. : 13/811139
DATED : September 30, 2014
INVENTOR(S) : Inoue et al.

It is certified that error appears in the above-identified patent and that said Letters Patent is hereby corrected as shown below:

On the Title Page

Item (56) under FOREIGN PATENT DOCUMENTS, after 101771119 delete "7/2007" and insert --7/2010--.

Signed and Sealed this
Thirty-first Day of March, 2015

Michelle K. Lee
*Director of the United States Patent and Trademark Office*